US011641719B2

(12) United States Patent
Zhang et al.

(10) Patent No.: US 11,641,719 B2
(45) Date of Patent: May 2, 2023

(54) MANUFACTURING METHOD OF PRINTED CIRCUIT BOARD

(71) Applicant: SHENNAN CIRCUITS CO., LTD., Shenzhen (CN)

(72) Inventors: Hegen Zhang, Shenzhen (CN); Xianyou Deng, Shenzhen (CN); Jinfeng Liu, Shenzhen (CN); Fuyu Xiang, Shenzhen (CN); Bo Wang, Shenzhen (CN); Zhicheng Yang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 75 days.

(21) Appl. No.: 16/953,331

(22) Filed: Nov. 20, 2020

(65) Prior Publication Data
US 2021/0204413 A1    Jul. 1, 2021

Related U.S. Application Data

(63) Continuation of application No. PCT/CN2020/077649, filed on Mar. 3, 2020.

(30) Foreign Application Priority Data

Dec. 31, 2019  (CN) .......................... 201911422825.1

(51) Int. Cl.
  *H05K 3/46* (2006.01)
  *B32B 38/10* (2006.01)
  *H05K 3/44* (2006.01)

(52) U.S. Cl.
  CPC ............. *H05K 3/44* (2013.01); *H05K 3/4697* (2013.01); *B32B 38/10* (2013.01); *B32B 2457/08* (2013.01); *H05K 2203/068* (2013.01)

(58) Field of Classification Search
  CPC ..... H05K 2203/068; H05K 2203/0228; H05K 2201/096; H05K 3/4697; B29C 37/0075; B32B 2457/08; B32B 38/10
  See application file for complete search history.

(56) References Cited

U.S. PATENT DOCUMENTS

| | | | |
|---|---|---|---|
| 6,350,387 B2 | 2/2002 | Caron et al. | |
| 2008/0233353 A1* | 9/2008 | Sakurai | B23C 3/00 83/337 |

(Continued)

FOREIGN PATENT DOCUMENTS

| | | |
|---|---|---|
| CN | 102523685 A | 6/2001 |
| CN | 109041459 A | 6/2012 |

(Continued)

OTHER PUBLICATIONS

International search report, Application No. PCT/CN2020/077649, dated Oct. 12, 2020.

(Continued)

*Primary Examiner* — Scott W Dodds

(57) ABSTRACT

The present disclosure provides a printed circuit board and a manufacturing method of the printed circuit board. The manufacturing method may include: at least two core plates may be provided; a composite anti-glue film assembly may be arranged at a preset position of one of the at least two core plates, the composite anti-glue film assembly may include a first anti-glue film layer, a second anti-glue film layer and a bonding layer. The first anti-glue film layer may contact the preset position. The first anti-glue film layer may be a polyimide layer. The bonding layer may be configured to bond the first anti-glue film layer and the second anti-glue film layer together to produce the composite anti-glue film assembly. Two adjacent core plates may be connected (Continued)

through a medium layer. The core plates may be cut-out and form the printed circuit board.

13 Claims, 6 Drawing Sheets

(56) References Cited

U.S. PATENT DOCUMENTS

| | | | | |
|---|---|---|---|---|
| 2013/0299223 | A1* | 11/2013 | Yoo ..................... | H05K 3/4697 174/250 |
| 2014/0023847 | A1* | 1/2014 | Kochiyama ............ | C08G 73/10 428/458 |
| 2021/0130653 | A1* | 5/2021 | Fujiwara ................ | B32B 27/08 |

FOREIGN PATENT DOCUMENTS

| | | |
|---|---|---|
| CN | 108990319 A | 12/2018 |
| CN | 109618509 A | 4/2019 |
| JP | 2014093527 A | 5/2014 |
| JP | 2019121764 A | 7/2019 |
| JP | 2019121766 A | 7/2019 |

OTHER PUBLICATIONS

Notice of Reasons for Refusal, Japanese Patent Application No. 2020568455 dated Mar. 22, 2022(6 pages).

* cited by examiner

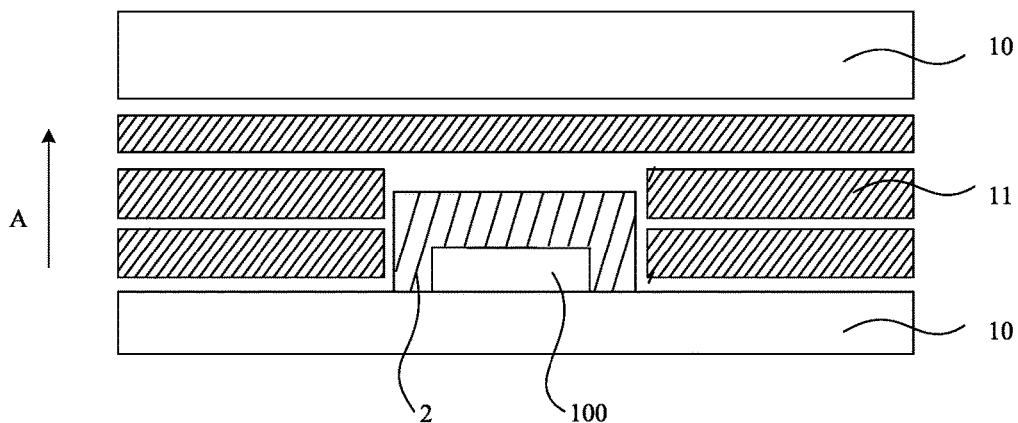

Fig. 3

| the composite anti-glue film assembly may be arranged on the pre-set position of one of the core plates, such that the first anti-glue film layer of the composite anti-glue film assembly may contact the pre-set position | S200 |
|---|---|
| the composite anti-glue film assembly may be press-fitted, such that the composite anti-glue film assembly may contact a surface of the core plate other than the pre-set position, thus the pre-set position may be wrapped by the composite anti-glue film assembly | S201 |

Fig. 4

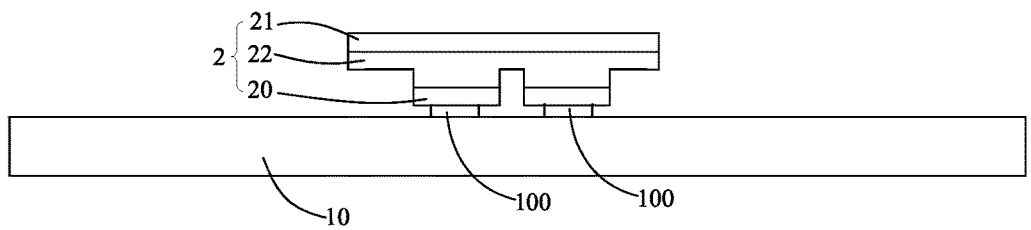

Fig. 5

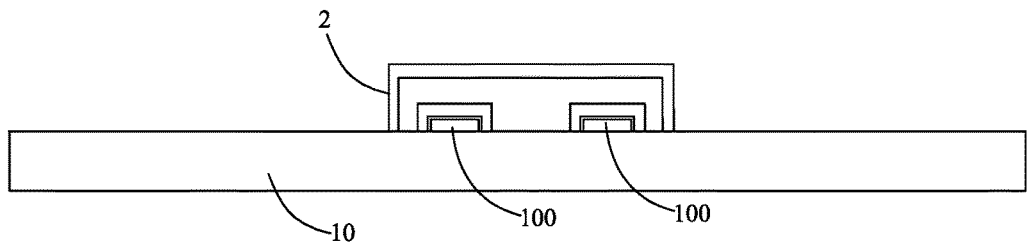

Fig. 6

| the core plates may be processed by means of the controlled-depth milling, such that the composite anti-glue film assembly as well as the core plates and the media layer corresponding to the composite anti-glue film assembly may be separated from the core plates and the media layer at other positions | S300 |

| the composite anti-glue film assembly as well as the core plates and the media layer corresponding to the composite anti-glue film assembly may be removed from the pre-set position of the core plate, so as to produce the PCB | S301 |

Fig. 7

| the pre-set position of the multi-layer adhesive tape layer may be cut out by means of the controlled-depth milling, to separate the polyimide layers and the adhesive layers at the pre-set position from the polyimide layers and the adhesive layers at other positions | ~ S600 |

↓

| the polyimide layers and the adhesive layers at the pre-set position may be removed from the multi-layer adhesive tape layer, to produce a composite anti-glue film assembly | ~ S601 |

Fig. 12

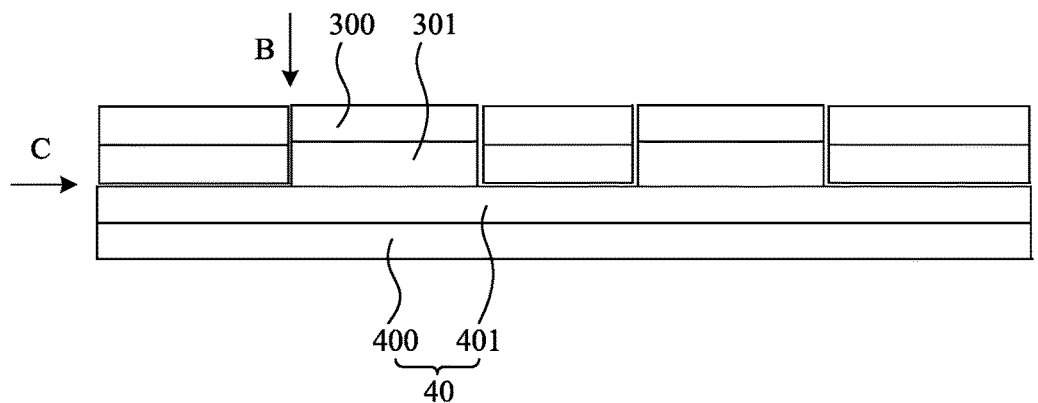

Fig. 13

MANUFACTURING METHOD OF PRINTED CIRCUIT BOARD

CROSS REFERENCE TO RELATED APPLICATION

The present application is a continuation-application of International (PCT) Patent Application No. PCT/CN2020/077649 filed on Mar. 3, 2020, which claims foreign priority of China Patent Application No. 201911422825.1, filed on Dec. 31, 2019 in the National Intellectual Property Administration of China, the entire contents of which are hereby incorporated by reference in their entireties.

TECHNICAL FIELD

The present disclosure relates to a technical field of printed circuit board fabrication, and more particular to a manufacturing method of a printed circuit board and a printed circuit board.

BACKGROUND

During a manufacturing process of a PCB (printed circuit board), a prepreg sheet may be used to bond two adjacent core plates together. However, in a specific manufacture process, the prepreg sheet may often accidentally fall to or overflow to a preset position of the core plates, causing the product to be scrapped.

Nowadays, in order to prevent the prepreg sheet from accidentally falling to or overflowing to the preset position of the core plate, a high temperature resistant adhesive tape may generally be arranged at the preset position of the core plate, such that the preset position of the core plate may be covered by the adhesive tape, thereby preventing the prepreg sheet from falling to or overflowing to the preset position.

However, because the adhesive layer of the adhesive tape is in contact with the preset position of the core plate, after the processing of the PCB has finished, a glue of the adhesive tape may remain in the preset position, which may affect the quality of the product.

SUMMARY OF THE DISCLOSURE

A printed circuit board and a manufacturing method of the printed circuit board may be provided in the present disclosure. This manufacturing method can not only prevent the prepreg sheet from falling to or overflowing to the preset position of the core plate, but also does not cause a problem that a glue of the component itself remains in the preset position of the core plate after a manufacturing process of the printed circuit board is finished, thereby effectively increasing a product pass rate.

In order to solve the above-mentioned technical problems, the first technical solution adopted in the present disclosure is to provide a manufacturing method of a printed circuit board. The manufacturing method may include: at least two core plates may be provided; a composite anti-glue film assembly may be arranged at a preset position of one of the at least two core plates, the composite anti-glue film assembly may include a first anti-glue film layer, a second anti-glue film layer and a bonding layer that are laminatingly disposed and bonded to each other, the first anti-glue film layer may contact the preset position of one of the at least two core plates, the first anti-glue film layer may be a polyimide layer, the bonding layer may be configured to bond the first anti-glue film layer and the second anti-glue film layer together to produce the composite anti-glue film assembly; two adjacent core plates may be connected by a medium layer, the composite anti-glue film assembly may be arranged between at least two core plates; and the core plate may be cut out to define an opening, to expose the preset position.

To solve the above-mentioned technical problems, a second technical solution adopted by the present disclosure is to provide a manufacturing method of a printed circuit board. The manufacturing method of the printed circuit board may include: a first core plate and a second core plate may be provided, a pad may be arranged on a first side of the first core plate; a composite anti-glue film assembly may be arranged on the first side of the first core plate to wrap the pad, the composite anti-glue film assembly may include a first anti-glue film layer, a second anti-glue film layer and a bonding layer disposed between the first anti-glue film layer and the second anti-glue film layer, the first anti-glue film layer may be configured to contact the pad, the bonding layer may be configured to bond the first anti-glue film layer and the second anti-glue film layer together to produce the composite anti-glue film assembly; the first core plate and the second core plate may be connected through a medium layer, the composite anti-glue film assembly may be arranged between the first core plate and the second core plate; and the composite anti-glue film assembly, a part of the medium layer and a part of the second core plate corresponding to the composite anti-glue film assembly may be removed and the pad may be exposed.

A printed circuit board and a manufacturing method of the printed circuit board may be provided in the present disclosure. The manufacturing method may provide the at least two core plates. Two adjacent core plates may be connected by the medium layer. The core plate then may be cut-out to define an opening to expose the preset position of the core plate, and the printed circuit board may be obtained. As the composite anti-glue film assembly is arranged at the preset position of one core plate of the at least two core plates, the composite anti-glue film assembly could protect the preset position of the core plate, thereby effectively preventing the medium layer from falling to or overflowing to the preset position. Meanwhile, the composite anti-glue film assembly may be configured to include a first anti-glue film layer, a second anti-glue film layer and a bonding layer that are laminatingly disposed and bonded to each other. The first anti-glue film layer may contact the preset position of one of the core plates. And the first anti-glue film layer may be a polyimide layer. Thus not only the preset position of the core plate is protected, but also the problem that a glue of the component itself remains in the preset position of the core plate which occurs after the manufacture process of the printed circuit board is completed may be avoided. Thus a product scrap due to the glue remaining in the preset position of the core plate may be avoided. A product pass rate may be effectively increased. Otherwise, through a provision of the second anti-glue film layer, the second anti-glue film layer may further prevent the medium layer between the at least two core plates from contacting the preset position, and the preset position of the core plate may be further protected.

BRIEF DESCRIPTION OF THE DRAWINGS

FIG. 3 is a schematic structural diagram of the PCB after being processed in operations S10 to S12 in FIG. 2.

FIG. 4 is a specific schematic flowchart of an operation S11 in FIG. 2.

FIG. 5 is a schematic structural diagram of a product corresponding to an operation S200 in FIG. 4.

FIG. 6 is a schematic structural diagram of a product corresponding to an operation S201 in FIG. 4.

FIG. 7 is a specific schematic flowchart of an operation S13 in FIG. 2.

FIG. 12 is a specific schematic flowchart of an operation S502 in FIG. 10.

FIG. 13 is a schematic structural diagram of a product corresponding to an operation S600 in FIG. 12.

DETAILED DESCRIPTION

Figure 1:
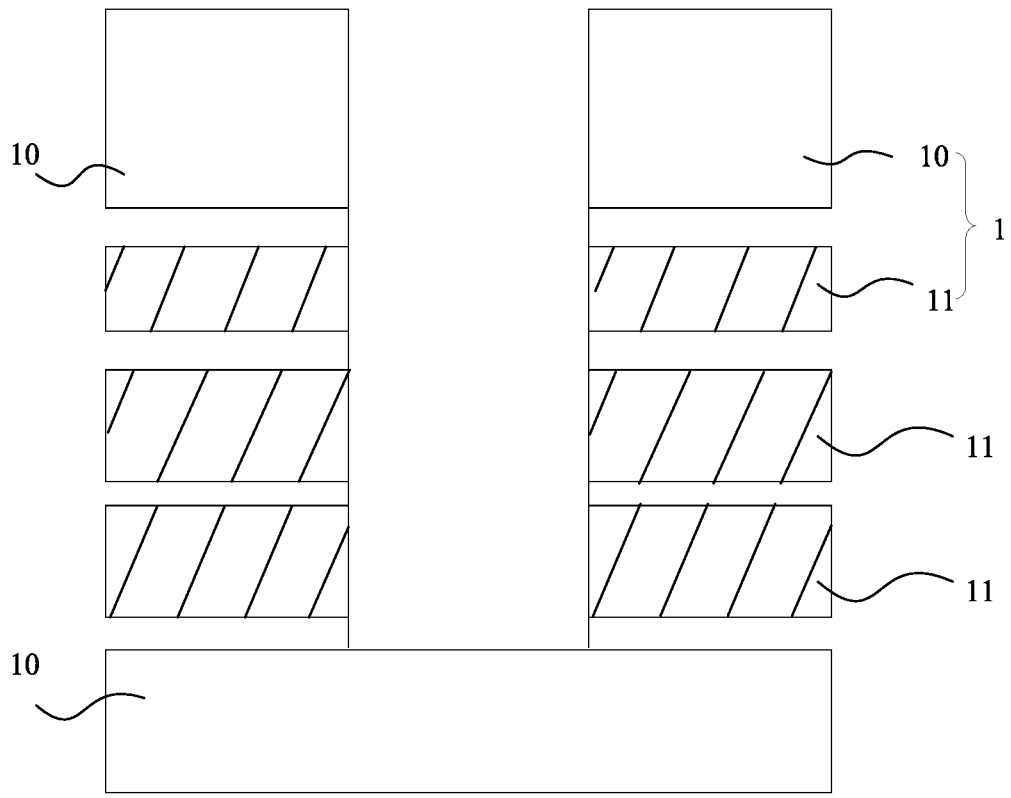
FIG. 1 is a schematic structural diagram of a PCB according to one embodiment of the present disclosure.

Technical solutions in embodiments of the present disclosure will be described clearly and thoroughly in connection with accompanying drawings of the embodiments of the present disclosure. Obviously, the described embodiments are only a part of the embodiments, but not all of them. All other embodiments by a person of ordinary skill in the art based on embodiments of the present disclosure without creative efforts should all be within the protection scope of the present disclosure.

The terms 'first', 'second', and 'third' in this disclosure are only for the purpose of description, and cannot be construed as indicating or implying relative importance or as implicitly indicating the number of technical features referred to. Therefore, the features defined with 'first', 'second', and 'third' may explicitly or implicitly include at least one of the features. In the description of the present disclosure, 'a plurality of' means at least two, such as two, three, etc., unless otherwise specifically defined. All directional indicators (such as up, down, left, right, front, back . . . ) in embodiments of the present disclosure are only used to explain a motion state, a relative positional relationship between the components in a specific posture (as shown in the drawings). If the specific posture changes, then the directional indication will change accordingly. In addition, the terms 'include', 'comprise' and any variations thereof are intended to cover non-exclusive inclusion. For example, a process, a method, a system, a product, or a device that includes a series of operations or units is not limited to the listed operations or units, but optionally includes unlisted operations or units, or optionally also includes other operations or units inherent to these processes, methods, products or devices.

Reference to 'embodiments' herein means that a specific feature, structure, or characteristic described in conjunction with the embodiments may be included in at least one embodiment of the present disclosure. The existence of this phrase in various positions in the specification does not necessarily refer to the same embodiment, nor is it an independent or alternative embodiment mutually exclusive with other embodiments. Those skilled in the art may explicitly and implicitly understand that, the embodiments described herein may be combined with other embodiments.

The present disclosure will be described in detail below with reference to the drawings and embodiments.

FIG. 1 is a schematic structural diagram of a PCB according to some embodiments of the present disclosure. In the present embodiment, a kind of PCB 1 may be provided. The PCB 1 may include at least two core plates 10 and a medium layer 11 configured to connect two adjacent core plates 10. The specific structure of the PCB 1 is illustrated in FIG. 1.

Specifically, the PCB 1 may be made by the following manufacturing method of PCB.

Figure 2:
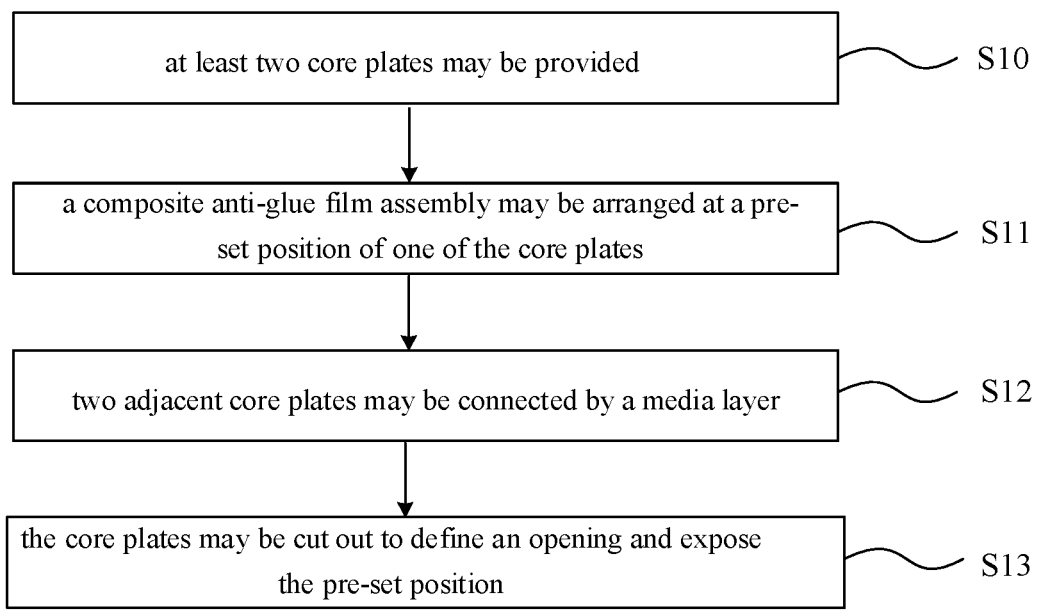
FIG. 2 is a schematic flowchart of a manufacturing method of PCB according to a first embodiment of the present disclosure.

FIG. 2 is a schematic flowchart of the manufacturing method of the PCB according to a first embodiment of the present disclosure. FIG. 3 is a schematic structural diagram of a PCB after being processed in an operation S10 to an operation S12 in FIG. 2.

In the present embodiment, a manufacturing method of the PCB is provided. The manufacturing method may include the following operations.

Operation S10: at least two core plates may be provided.

Referring to FIG. 1, the core plates 10 may include two core plates, namely a top core plate 10 and a bottom core plate 10. The following embodiments all follow this example. Of course, in some other embodiments, the core plate 10 may also include an interlayer. The interlayer may be connected to both the top core plate 10 and the bottom core plate 10 through the medium layers 11. In some embodiments, the interlayer may be a single-layer core plate. In some other embodiments, the interlayer may have a multiple-layer structure. The multiple-layer structure may specifically include a first internal core plate and a second internal core plate that are laminated. The first internal core plate and the second internal core plate may be connected to each other through a corresponding medium layer 11.

Specifically, the core plate 10 may include a substrate plate and at least one metal layer arranged on at least one surface of the substrate plate. Specifically, the above-mentioned core plate 10 may be a copper clad plate. The copper clad plate may be a basic material for fabricating a circuit board. The copper clad plate may include a base material plate and a copper foil covering the base material plate. The base material plate may be composed of multiple bonding sheets. The bonding sheets may be made from paper substrate plates, glass fiber cloth substrate plates, synthetic fiber cloth substrate plates, non-woven cloth substrate plates, composite substrate plates or other materials impregnated with resins. One surface or both surfaces of the finished base material plate may be coated by a copper foil, and then can be processed by heat-press curing to obtain a copper clad plate.

Operation S11: a composite anti-glue film assembly may be arranged at a preset position of one of the core plates.

Specifically, the composite anti-glue film assembly 2 may be arranged on a side surface of the bottom core plate 10 closer to the top core plate 10. Specifically, the composite anti-glue film assembly 2 may include a first anti-glue film layer 20, a second anti-glue film layer 21 and a bonding layer 22 that are laminatingly disposed and bonded to each other. The first anti-glue film layer 20 may contact a preset position 100 of a core plate 10, so as to protect the preset position 100, thereby preventing a prepreg sheet from dropping to or overflowing to the preset position 100 of the core plate 10 during subsequent processing operations. The second anti-glue film layer 21 and the first anti-glue film layer 20 may be laminatingly disposed. The second anti-glue film layer 21 may be arranged on one side of the first anti-glue film layer 20 away from the preset position 100 of the core plate 10, so as to further prevent the medium layer 11 between at least two core plates 10 from contacting the preset position 100. The bonding layer 22 may be configured to bond the first anti-glue film layer 20 and the second anti-glue film layer 21 together to produce the composite anti-glue film assembly 2.

Specifically, the above-mentioned first anti-glue film layer 20 may be a polyimide layer, thus the glue of the composite anti-glue film assembly 2 itself could be effectively prevented from remaining in the preset position 100 of the core plate 10 after the processing of the PCB 1 is completed. Thus, product scrap problems due to the remaining glue present at the preset position 100 of the core plate 10 may be avoided, thereby increasing the product pass rate.

Specifically, in some embodiments, the preset position 100 of the core plate 10 may be provided with a pad. The composite anti-glue film assembly 2 may be particularly arranged at a position of the core plate 10 where the pad resides, so as to protect the pad on the core plate 10. It should be appreciated that, in this implementation, the preset position 100 of the core plate 10 may specifically refer to a position where the pad resides.

Operation S12: two adjacent core plates may be connected by a medium layer.

Specifically, the medium layer 11 may be a prepreg sheet. The prepreg sheet may be arranged between the top core plate 10 and the bottom core plate 10 to connect the two core plates 10 together. Specifically, the composite anti-glue film assembly 2 may be arranged between at least two core plates 10.

Specifically, the prepreg sheet configured to be an interlayer bonding layer during a lamination may be mainly composed of resins and reinforcing materials. When manufacturing multiple-layer circuit boards, glass fiber cloth may be employed as the reinforcing material. The glass fiber cloth may be impregnated with resin-adhesive-solution, and then pre-baked to produce a thin sheet by a heat treatment. The thin sheet may soften under heating and pressure, and may solidify after cooling. The thin sheet may be viscous and can bond two adjacent layers during the high temperature press-fitting.

Specifically, a structure of a product after being processed by the operation S11 to the operation S12 may be particularly illustrated in FIG. 3.

Operation S13: the core plate may be cut out to define an opening to expose the preset position.

Specifically, a cutting operation may be performed along the preset position 100 of the core plate 10 by means of a controlled-depth milling, to expose the preset position 100 on the core plate 10, so as to fabricate the PCB 1. The specific structure of the PCB 1 may be illustrated in FIG. 1.

In the manufacturing method of PCB provided in this embodiment, at least two core plates 10 may be provided, two adjacent core plates 10 may be connected together by the medium layer 11, and the core plate 10 may be cut out to define an opening to expose the preset position 100 of the core plate 10, so as to obtain the PCB 1. Since the composite anti-glue film assembly 2 may be arranged at the preset position 100 of one core plate 10 of the at least two core plates 10, the preset position 100 of the core plate 10 may be protected by the composite anti-glue film assembly 2, so that the medium layer 11 may be effectively prevented from dropping to or overflowing to the preset position 100. Meanwhile, the composite anti-glue film assembly 2 may be configured to include the first anti-glue film layer 20, the second anti-glue film layer 21 and the bonding layer 22 that are laminatingly disposed and bonded to each other. The first anti-glue film layer 20 may contact the preset position 100 of one of the core plates 10. The first anti-glue film layer 20 may be a polyimide layer. Thus, not only the preset position 100 of the core plate 10 may be protected, but also the problem of the glue of the composite anti-glue film assembly 2 itself remaining in the preset position 100 of the core plate 10, which occurs after the processing of the PCB 1 is completed, may be avoided. Product scrap due to the glue remaining in the preset position 100 of the core plate 10 can be avoided, and the product pass rate can be effectively increased. Otherwise, through a provision of the second anti-glue film layer 21, the second anti-glue film layer 21 may further prevent the medium layer 11 between at least two core plates 10 from contacting the preset position 100, the preset position 100 of the core plate 10 may be further protected.

FIG. 4 is a specific flowchart of the operation S11 in FIG. 2. FIG. 5 is a schematic structural diagram of a product of an operation S200 in FIG. 4. FIG. 6 is a schematic structural diagram of a product of an operation S201 in FIG. 4. In some embodiments, the operation S13 may specifically include the following operations.

Operation S200: the composite anti-glue film assembly may be arranged at the preset position of one of the core plates, such that the first anti-glue film layer of the composite anti-glue film assembly may contact the preset position.

Specifically, the structure of the product after being processed by the operation S200 may be particularly illustrated in FIG. 5.

Operation S201: the composite anti-glue film assembly may be press-fitted, such that the composite anti-glue film assembly may contact a surface of the core plate other than the preset position, thus the preset position may be wrapped by the composite anti-glue film assembly.

Specifically, the composite anti-glue film assembly 2 may particularly have a concave shape after being press-fitted. The composite anti-glue film assembly 2 may contact the surface of the core plate 10 other than the preset position 100 to wrap the preset position 100, thereby protecting the preset position 100 on the core plate 10, and preventing the medium layer 11 from dropping to or overflowing to the preset position 100 of the core plate 10. Specifically, the structure of the product after being processed by the operation S201 may be particularly illustrated in FIG. 6.

Figure 8:
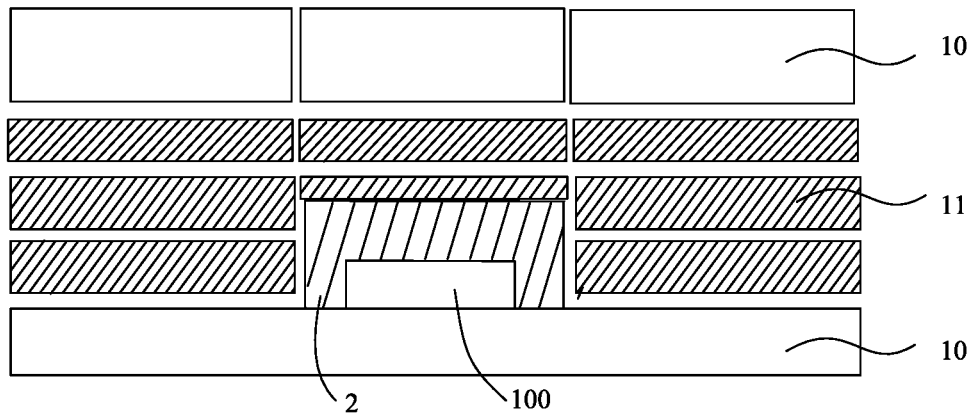
FIG. 8 is a schematic structural diagram of a product corresponding to an operation S300 in FIG. 7.

FIG. 7 is a specific schematic flowchart of the operation S13 in FIG. 2, FIG. 8 is a schematic structural diagram of a product of the operation S300 in FIG. 7. In some embodiments, the operation S13 may specifically include the following operations.

Operation S300: the core plate may be processed by means of the controlled-depth milling, such that the composite anti-glue film assembly as well as the core plate and the medium layer corresponding to the composite anti-glue film assembly may be separated from the core plate and the medium layer at other positions.

Specifically, the structure illustrated in FIG. 3 may be processed by means of controlled-depth milling. The structure of the product after processing may be particularly illustrated in FIG. 8.

The core plate 10 and the medium layer 11 corresponding to the composite anti-glue film assembly 2 may specifically refer to the core plate 10 and the medium layer 11 right above the composite anti-glue film assembly 2. The right above side of the composite anti-glue film assembly 2 may specifically refer to a direction indicated by A in FIG. 3.

Operation S301: the composite anti-glue film assembly as well as the core plate and the medium layer corresponding to the composite anti-glue film assembly may be removed from the preset position of the core plate, so as to produce the PCB.

Specifically, the structure of the PCB 1 after processing by the operation S301 may be particularly illustrated in FIG. 1.

It should be appreciated that, the above-mentioned cut out of the core plate 10 can be accomplished by a milling cutter, which may move vertically downward along a stacking direction of the core plate 10, so that the core plate 10 and the medium layer 11 right above the composite anti-glue film assembly 2 may be separated from the core plate 10 and the medium layer 11 at other positions. FIG. 8 shows more detail. The composite anti-glue film assembly 2 as well as the core plate 10 and the medium layer 11 right above the composite anti-glue film assembly 10 may be removed, to produce the PCB 1 shown in FIG. 1.

In the manufacturing method of PCB provided in this embodiment, at least two core plates 10 may be provided, two adjacent core plates 10 may be connected together by the medium layer 11, then the core plate 10 may be cut-out to define an opening to expose the preset position 100 of the core plate 10, so as to obtain the PCB 1. As the composite anti-glue film assembly 2 may be arranged at the preset position 100 of one core plate 10 of the at least two core plates 10, the preset position 100 of the core plate 10 may be protected by the composite anti-glue film assembly 2, so that the medium layer 11 may be effectively prevented from dropping to or overflowing to the preset position 100. Meanwhile, the composite anti-glue film assembly 2 may be configured to include the first anti-glue film layer 20, the second anti-glue film layer 21 and the bonding layer 22 that are laminatingly disposed and bonded to each other. The first anti-glue film layer 20 may contact the preset position 100 of one of the core plates 10. The first anti-glue film layer 20 may be a polyimide layer. Thus not only the preset position 100 of the core plate 10 may be protected, but also the problem that the glue of the composite anti-glue film assembly 2 itself remains in the preset position 100 of the core plate 10 may be avoided. The problem may occur after the processing of the PCB 1 is completed. Therefore, the product scrap due to the glue remaining in the preset position 100 of the core plate 10 may be avoided. The pass rate of the product may be effectively increased. Otherwise, through a provision of the second anti-glue film layer 21, the second anti-glue film layer 21 may further prevent the medium layer 11 between at least two core plates 10 from contacting the preset position 100, so that the preset position 100 of the core plate 10 may be further protected.

Figure 9:
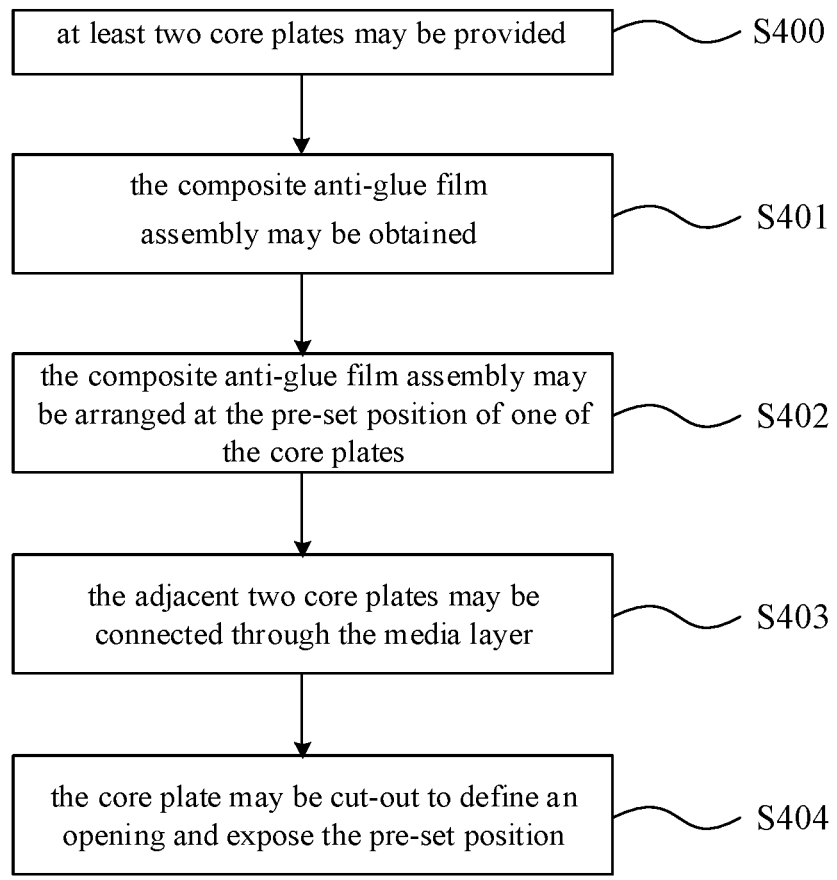
FIG. 9 is a schematic flowchart of a manufacturing method of PCB according to a second embodiment of the present disclosure.

FIG. 9 is a schematic flowchart of a manufacturing method of PCB according to a second embodiment of the present disclosure. In the present embodiment, another manufacturing method of PCB is provided. The manufacturing method may include the following operations.

Operation S400: at least two core plates may be provided.

Specifically, the concrete implementation process of the operation S400 is identical to the implementation process of the operation S10 referred in the above-mentioned first embodiment. More detailed information may be found in the relevant text description of the above-mentioned first embodiment, which will not be repeated here in this embodiment.

Operation S401: the composite anti-glue film assembly may be obtained.

Figure 10:
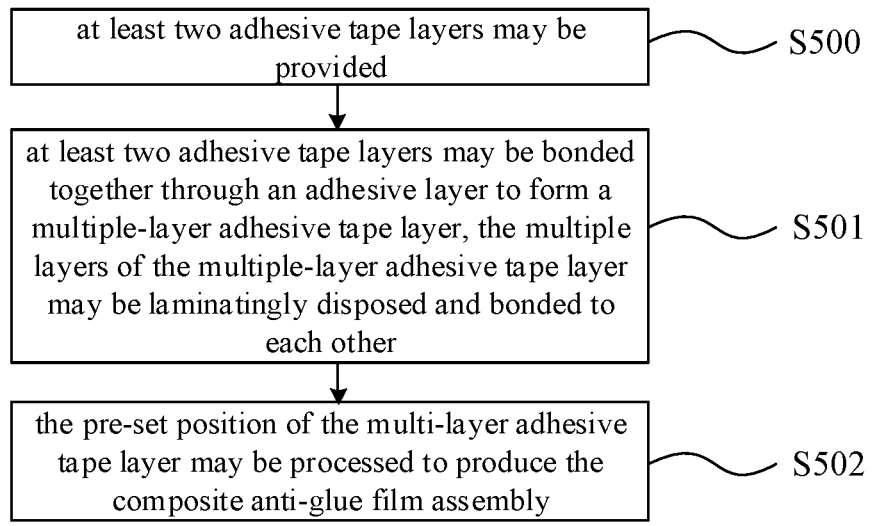
FIG. 10 is a schematic flowchart of a specific implementation of an operation S401 in FIG. 9.
Figure 11:
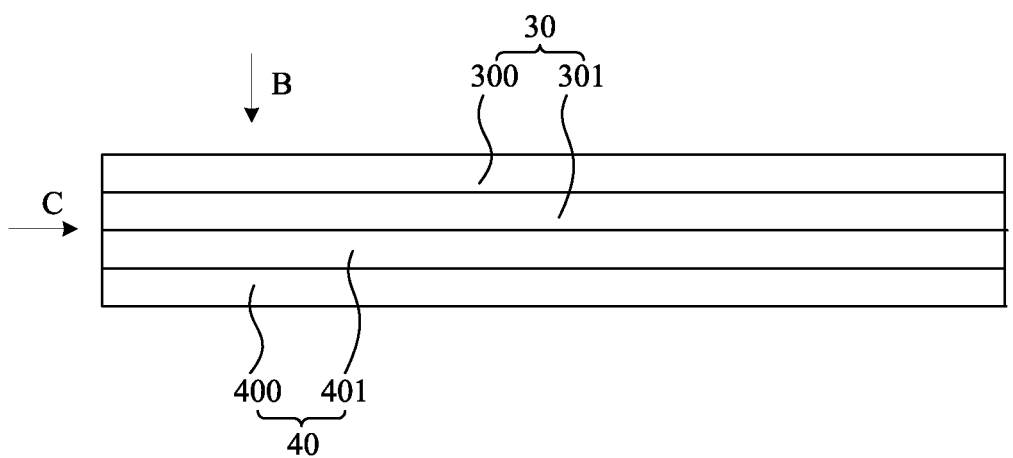
FIG. 11 is a schematic structural diagram of a product after being processed in operations S500 and S501 in FIG. 10.

FIG. 10 is a specific schematic flowchart of the operation S401 in FIG. 9, and FIG. 11 is a schematic structural diagram of a product after being processed in operations S500 to S501 in FIG. 10. The operation S401 may particularly includes the following operations.

Operation S500: at least two adhesive tape layers may be provided.

Specifically, the adhesive tape layers may include polyimide layers and adhesive layers that are laminatingly disposed and bonded to each other.

Operation S501: at least two adhesive tape layers may be bonded together through an adhesive layer to form a multiple-layer adhesive tape layer. The multiple layers of the multiple-layer adhesive tape layer may be laminatingly disposed and bonded to each other.

Specifically, in some embodiments, any two adhesive tape layers, namely a first adhesive tape layer 30 and a second adhesive tape layer 40 may be taken. The first adhesive tape layer 30 may include a first polyimide layer 300 and a first adhesive layer 301. The second adhesive tape layer 40 may include a second polyimide layer 400 and a second adhesive layer 401. In a specific implementation process, the first adhesive layer 301 of the first adhesive tape layer 30 and the second adhesive layer 401 of the second adhesive tape layer 40 may be arranged oppositely and bonded to form a multiple-layer adhesive tape layer. Specifically, the specific structure of the multiple-layer adhesive tape layer may be illustrated in FIG. 11. The following embodiments are all based on this example.

Operation S502: the preset position of the multiple-layer adhesive tape layer may be processed to form the composite anti-glue film assembly.

FIG. 12 is a specific schematic flowchart of the operation S502 in FIG. 10, and FIG. 13 is a schematic structural diagram of a product corresponding to the operation S600 in FIG. 12. The operation S502 may specifically include the following operations.

Operation S600: the preset position of the multiple-layer adhesive tape layer may be cut by means of the controlled-depth milling, to separate the polyimide layer and the adhesive layer at the preset position from the polyimide layer and the adhesive layer at other positions.

Specifically, the structure shown in FIG. 11 may be cut along a direction indicated by B direction and a direction indicated by C direction by means of the controlled-depth milling, such that the polyimide layer and the adhesive layer at the preset position of the multiple-layer adhesive tape layer may be separated from the polyimide layer and the adhesive layer at other positions. Specifically, a product structure after being processed in the operation 600 may be specifically illustrated in FIG. 13.

Operation S601: the polyimide layer and the adhesive layer at the preset position may be removed from the multiple-layer adhesive tape layer, to produce a composite anti-glue film assembly.

Specifically, the structure of the product after being processed in the operation S601 may be particularly illustrated in FIG. 5.

Specifically, the composite anti-glue film assembly 2 may have a stepped shape. In a specific implementation process, a first polyimide layer 300 of the first adhesive tape layer 30 may form a first anti-glue film layer 20 of the composite anti-glue film assembly 2. A second polyimide layer 400 of the second adhesive tape layer 40 may form a second anti-glue film layer 21. The first adhesive layer 301 may form the first bonding layer. The second adhesive layer 401 may form the second bonding layer. The first bonding layer and the second bonding layer may collectively form the bonding layer 22 of the composite anti-glue film assembly 2.

Specifically, a surface area of the first anti-glue film layer 20 may be greater than a surface area of the preset position 100 of the core plate 10, such that after the composite anti-glue film assembly 2 has been press-fitted, the first anti-glue film layer 20 could contact surface of the core plate 10 other than the preset position 100. Therefore, it is ensured that the prepreg sheet would not fall from a position right above the preset position 100 to the preset position 100, and meanwhile would not overflow to the preset position 100 from two sides of the preset position 100.

Specifically, a surface area of the second anti-glue film layer 21 may be greater the surface area of the first anti-glue film layer 20, such that after the composite anti-glue film assembly 2 has been press-fitted, the second anti-glue film layer 21 could contact the surface of the core plate 10 other than the first anti-glue film layer 20 to wrap the bonding layer 22, the first anti-glue film layer 20 and the preset position 100. Thus, the medium layer 11 between the at least two layers of core plates 10 may be prevented from falling to or overflowing to the preset position 100 by the second anti-glue film layer 21. Therefore, the preset position 100 of the core plate 10 may be further protected.

Specifically, a surface area of the first bonding layer may be identical to the surface area of the first anti-glue film layer 20. A surface area of the second bonding layer may be identical to the surface area of the second anti-glue film layer 21.

Of course, in some other embodiments, the bonding layer 22 may further include an intermediate bonding layer between the first bonding layer and the second bonding layer. The intermediate bonding layer may include several polyimide layers and adhesive layers that are laminatingly disposed and bonded to each other.

Operation S402: the composite anti-glue film assembly may be arranged at the preset position of one of the core plates.

Operation S403: the adjacent two core plates may be connected through the medium layer.

Operation S404: the core plate may be cut-out to define an opening, to expose the preset position.

Specifically, a specific implementation process of the operation S402 to the operation S404 may be identical to the implementation process referred to in the operation S11 to the operation S13. For more details, please referring to the corresponding description text of the above-mentioned first embodiment, which will not be repeated one by one in this embodiment.

In the manufacturing method of PCB provided in this embodiment, at least two core plates 10 may be provided. Two adjacent core plates 10 may be connected together by the medium layer 11. Then the core plates 10 may be cut-out to define an opening, to expose the preset position 100 of the core plate 10, so as to obtain the PCB 1. Since the composite anti-glue film assembly 2 may be arranged at the preset position 100 of one core plate 10 of the at least two core plates 10, the preset position 100 of the core plate 10 may be protected by the composite anti-glue film assembly 2, so as to effectively prevent the medium layer 11 from dropping to or overflowing to the preset position 100. Meanwhile, the composite anti-glue film assembly 2 may be configured to include the first anti-glue film layer 20, the second anti-glue film layer 21 and the bonding layer 22 that are laminatingly disposed and bonded to each other. The first anti-glue film layer 20 may contact the preset position 100 of one of the core plates 10. And the first anti-glue film layer 20 may be a polyimide layer. Thus not only the preset position 100 of the core plate 10 may be protected, but also the problem that the glue of the composite anti-glue film assembly 2 itself remains in the preset position 100 of the core plate 10 may be avoided. The problem may occur after the processing of the PCB 1 is completed. Therefore, the product scrap due to the glue remaining in the preset position 100 of the core plate 10 may be avoided, and the product pass rate may be effectively increased. Otherwise, through a provision of the second anti-glue film layer 21, the second anti-glue film layer 21 may further prevent the medium layer 11 between at least two core plates 10 from contacting the preset position 100, and the preset position 100 of the core plate 10 may be further protected.

The above are only implementations of the present disclosure, and do not limit the patent scope of the present disclosure. Any equivalent changes to the structure or processes made by the description and drawings of this application or directly or indirectly used in other related technical field may be included in the protection scope of this application.

What is claimed is:

1. A manufacturing method of printed circuit board, comprising:

obtaining a composite anti-glue film assembly;

providing at least two core plates;

arranging the composite anti-glue film assembly at a preset core position of one of the at least two core plates, the composite anti-glue film assembly comprises a first anti-glue film layer, a second anti-glue film layer and a bonding layer that are bonded to each other, the first anti-glue film layer is configured to contact the preset core position; the bonding layer is configured to bond the first anti-glue film layer and the second anti-glue film layer together to form the composite anti-glue film assembly;

connecting a first core plate and a second core plate of the at least two core plates through a medium layer, the composite anti-glue film assembly is arranged between the first core plate and the second core plate; and cutting out the second core plate to define an opening and exposing the preset core position by removing the composite anti-glue film assembly, the second core plate, and the medium layer from the preset core position, the operation of obtaining the composite anti-glue film assembly comprises:

providing a first adhesive tape layer and a second adhesive tape layer, the first adhesive tape layer comprises a first polyimide layer and a first adhesive layer that are bonded to each other, the second adhesive tape layer comprises a second polyimide layer and a second adhesive layer that are bonded to each other;

oppositely arranging and bonding the first adhesive layer of the first adhesive tape layer and the second adhesive layer of the second adhesive tape layer to produce the multiple-layer adhesive tape layer; and processing a preset tape position of the multiple-layer adhesive tape layer to produce the composite anti-glue film assembly, wherein the first polyimide layer of the first adhesive tape layer forms the first anti-glue film layer of the composite anti-glue film assembly, the second polyimide layer of the second adhesive tape layer forms the second anti-glue film layer, the first adhesive layer forms a first bonding layer, and the second adhesive layer forms a second bonding layer, the first bonding layer and the second bonding layer form the bonding layer of the composite anti-glue film assembly.

2. The manufacturing method of printed circuit board according to claim 1, wherein
the operation of processing the preset tape position to produce the composite anti-glue film assembly comprises:
cutting the preset tape position using controlled-depth milling, thereby separating the first polyimide layer, the first adhesive layer, the second polyimide layer and the second adhesive layer the at the preset tape position from the first polyimide layer, the first adhesive layer, the second polyimide layer and the second adhesive layer at other positions; and
removing the first polyimide layer, the first adhesive layer, the second polyimide layer and the second adhesive layer at the preset tape position from a remainder of the multiple-layer adhesive tape layer, to produce the composite anti-glue film assembly;
wherein the composite anti-glue film assembly has a stepped shape.

3. The manufacturing method of printed circuit board according to claim 1, wherein
the preset core position includes a central area of the first core plate and a pad on the central area; and
the operation of arranging the composite anti-glue film assembly at the preset core position comprises:
arranging the composite anti-glue film assembly to contact the pad; and
press-fitting the composite anti-glue film assembly, such that the composite anti-glue film assembly contacts a surface of the first core plate other than the preset core position to wrap the pad.

4. The manufacturing method of printed circuit board according to claim 3, wherein
after the composite anti-glue film assembly has been press-fitted, the composite anti-glue film assembly has a concave shape.

5. The manufacturing method of printed circuit board according to claim 1, wherein
the operation of cutting out the second core plate to expose the preset core position comprises:
processing the second core plate using controlled-depth milling, and separating portions of the second core plate and the medium layer corresponding to the composite anti-glue film assembly from the second core plate and the medium layer at other positions.

6. The manufacturing method of printed circuit board according to claim 1, wherein
the preset core position includes a central area of the first core plate and a pad arranged at the central area, and the composite anti-glue film assembly is configured to protect the pad.

7. The manufacturing method of printed circuit board according to claim 1, wherein
a surface area of the first anti-glue film layer is larger than a surface area of the preset core position, and a surface area of the second anti-glue film layer is larger than the surface area of the first anti-glue film layer.

8. The manufacturing method of printed circuit board according to claim 1,
wherein the first bonding layer covers the first anti-glue film layer, and the second bonding layer covers the second anti-glue film layer.

9. The manufacturing method of printed circuit board according to claim 8, wherein
a surface area of the first bonding layer is identical to a surface area of the first anti-glue film layer, a surface area of the second bonding layer is identical to a surface area of the second anti-glue film layer, and the surface area of the second bonding layer is larger than the surface area of the first bonding layer.

10. The manufacturing method of printed circuit board according to claim 8, wherein
the bonding layer further comprises an intermediate bonding layer bonded between the first bonding layer and the second bonding layer, and the intermediate bonding layer comprises several polyimide layers and adhesive layers that are bonded to each other.

11. A manufacturing method of printed circuit board, comprising:
obtaining a composite anti-glue film assembly,
providing a first core plate and a second core plate, wherein a pad is arranged on a first side of the first core plate;
arranging the composite anti-glue film assembly on the first side of the first core plate to wrap the pad, wherein the composite anti-glue film assembly comprises a first anti-glue film layer, a second anti-glue film layer and a bonding layer disposed between the first anti-glue film layer and the second anti-glue film layer, the first anti-glue film layer is configured to contact the pad, the bonding layer is configured to bond the first anti-glue film layer and the second anti-glue film layer together to produce the composite anti-glue film assembly;
connecting the first core plate and the second core plate through a medium layer, the composite anti-glue film assembly is arranged between the first core plate and the second core plate; and
removing the composite anti-glue film assembly, a part of the medium layer and a part of the second core plate corresponding to the composite anti-glue film assembly and exposing the pad,
the operation of obtaining the composite anti-glue film assembly comprises:
taking two adhesive tape layers, the two adhesive tape layers comprise a first adhesive tape layer comprising a first polyimide layer bonded to a first adhesive layer and a second adhesive tape layer comprising a second polyimide layer bonded to a second adhesive layer; and
oppositely arranging and bonding the first adhesive layer and the second adhesive layer to produce the composite anti-glue film assembly, wherein the first polyimide layer is the first anti-glue film layer, the second polyimide layer is the second anti-glue film layer, and the first adhesive layer and the second adhesive layer together form the bonding layer of the composite anti-glue film assembly.

12. The manufacturing method of printed circuit board according to claim 11, wherein
the medium layer is a prepreg.

13. The manufacturing method of printed circuit board according to claim 11, wherein
the operation of obtaining the composite anti-glue film assembly further comprises:
removing part of the composite anti-glue film assembly at a preset position to define a groove in the composite anti-glue film assembly,
wherein in the operation of arranging the composite anti-glue film assembly on the first side of the first core plate to wrap the pad, the pad is at least partly accommodated by the groove.

* * * * *